US006481368B1

United States Patent
Löfgren et al.

(10) Patent No.: US 6,481,368 B1
(45) Date of Patent: Nov. 19, 2002

(54) DEVICE AND A METHOD FOR HEAT TREATMENT OF AN OBJECT IN A SUSCEPTOR

(75) Inventors: Peter Löfgren, Västerås (SE); Yujing Liu, Västerås (SE)

(73) Assignee: ABB Research Ltd (SE)

( * ) Notice: Subject to any disclaimer, the term of this patent is extended or adjusted under 35 U.S.C. 154(b) by 0 days.

(21) Appl. No.: 09/431,047

(22) Filed: Nov. 1, 1999

(51) Int. Cl.$^7$ ............................................. C23C 16/507
(52) U.S. Cl. ................. 118/723 I; 118/723 R; 118/715; 156/345.48; 156/345.51; 156/345.52
(58) Field of Search .................. 427/249, 569; 118/725, 719, 723 E, 723 I; 422/22, 186.04; 266/275; 156/345; 219/121.4, 121.43, 121.51, 121.52, 668; 438/725, 710; 315/111.21; 204/192.12, 192.15, 192.17

(56) References Cited

U.S. PATENT DOCUMENTS

| | | | |
|---|---|---|---|
| 4,830,703 A | | 5/1989 | Matsutani ................. 423/348 |
| 5,136,978 A | * | 8/1992 | Ahern et al. .............. 118/725 |
| 5,316,795 A | * | 5/1994 | Patterson et al. .......... 427/249 |
| 5,346,578 A | * | 9/1994 | Benzig et al. ............. 156/345 |
| 5,482,257 A | * | 1/1996 | Holcombe et al. .......... 266/275 |
| 5,540,800 A | * | 7/1996 | Quan ..................... 156/345 |
| 5,540,824 A | * | 7/1996 | Yin et al. ............... 204/298.34 |
| 5,591,268 A | * | 1/1997 | Usui et al. .............. 118/723 E |
| 5,648,701 A | * | 7/1997 | Hooke et al. ............ 315/111.21 |
| 5,739,069 A | * | 4/1998 | Usui et al. .............. 438/710 |
| 5,741,460 A | * | 4/1998 | Jacob et al. ............. 422/22 |
| 5,868,832 A | | 2/1999 | Begg ..................... 117/32 |

FOREIGN PATENT DOCUMENTS

| | | |
|---|---|---|
| DE | 28 42 605 | 9/1978 |
| JP | 64-057600 * | 3/1989 ........... H01L/21/31 |
| JP | 401276634 A * | 11/1989 ........... H01L/21/31 |
| WO | WO 92/03588 | 3/1992 |

OTHER PUBLICATIONS

Calhoun, "An elementary derivation of the midplane magnetic field inside a pair of Helmholtz coils", Am. J. Phys. vol. 64, No. 11, pp. 1399–1404, Oct. 1995.*

Allain et al, "Characterization of magnetron-sputtered partially ionized deposition as a function of metal and gas species", J. Vac. Sci. Technol. A 18(3), pp. 797–801, Oct. 1999.*

Ventzek et al, "Investigation of electron source and ion flux uniformity in high plasma density inductively coupled etching tools using two-dimensional modeling", J. Vac. Sci. Technol. B 12(6), pp. 3118–3137, Nov. 1994.*

Paranjpe, "Modeling an inductively coupled plasma source", J. Vac. Sci. Technol. A 12(4), pp. 1221–1228, Jul. 1994.*

* cited by examiner

Primary Examiner—Gregory Mills
Assistant Examiner—Rudy Zervigon
(74) Attorney, Agent, or Firm—Connolly Bove Lodge & Hutz LLP

(57) ABSTRACT

A device for heat treatment of an object comprises a susceptor (9) having walls (10) surrounding an inner room (11) adapted to receive the object and Rf-field radiating means (12, 15) arranged outside the walls and adapted to heat the walls and by that said object. Said means comprises at least two coils (12, 15) with at least one turn each following upon each other in a longitudinal direction of the susceptor and a current source (17) arranged to cause a current to flow in each coil in a direction of rotation around the susceptor walls opposite to that of the other coil for heating said walls.

21 Claims, 3 Drawing Sheets

DEVICE AND A METHOD FOR HEAT TREATMENT OF AN OBJECT IN A SUSCEPTOR

TECHNICAL FIELD OF THE INVENTION AND PRIOR ART

The present invention relates to a device for heat treatment of an object comprising a susceptor having walls surrounding an inner room adapted to receive the object and Rf-field radiating means arranged outside the walls and adapted to heat the walls and by that said object, and a method according to the preamble of the independent method claim.

"Heat treatment of an object" is to be given a broad sense and includes all types of heat treatment of an object conceivable in such a susceptor, such as epitaxial growth of such an object in the form of a poly- or monocrystalline layer on a substrate received in the susceptor and annealing of a semiconductor wafer for removing damages therein caused by for instance ion implantation of dopants and for electrically activating such dopants then.

The invention is particularly but not in any way exclusively directed to such heat treatment at comparatively high temperatures, such as above 1 400° C., and is therefor of particular interest for materials needing such high temperatures for different kind of heat treatments as epitaxial growth and annealing. Such materials are for instance SiC, group III-nitrides and diamond.

A problem in common for such devices already known will now be described for the case of epitaxial growth of a layer by Chemical Vapour Deposition on a substrate received in the susceptor without limiting the invention thereto. Such a known device is schematically illustrated in FIG. 1 and 2. The Rf-field radiating means in such devices are formed by a coil 1 surrounding the susceptor 2 and wound around the susceptor from one end to the other in the longitudinal direction of the susceptor. The walls 3 of the susceptor are made of a material, such as graphite or tantalum, able to couple inductive with the Rf-field for inductive heating of the walls by an alternating magnetic field 4 therethrough.

The density of the magnetic flux through the susceptor walls will be higher in the middle 5 than at the ends 6, 7 of the susceptor as seen in the longitudinal direction thereof. In addition, heat losses from the susceptor will be much higher at the ends than in the middle because of the strong heat radiation at the ends having much larger surfaces for heat exchange with the surrounding gas than the middle section of the susceptor. This will in the case of a flow of precursor gases (indicated by an arrow 23) needed for said Chemical Vapour Deposition through the susceptor result in a considerably higher temperature of the gas flow in the middle of the susceptor than at the ends thereof. The epitaxial growth of most materials is strongly dependent upon a temperature gradient in the longitudinal direction of the susceptor. This means that the area for the growth will be limited to a small area with a lower temperature gradient in the middle of the susceptor. This means that a lower number of wafers may be grown in one and the same growth run than would it be possible to utilise a larger area of the inner room of the susceptor for the growth, which will of course result in remarkably higher costs for producing such wafers. Another disadvantage is that the quality of said wafers grown is affected by the temperature gradient, so that the quality of the objects grown will be lower, in spite of the choice of a small area for said growth, than would the temperature be nearly constant in the growth region. These problems are also there in the case of a heat treatment in the form of an annealing of a semiconductor wafer 8 damaged by ion implantation and they are even more accentuated in that case, since variations in the temperature will then result in different degree of activation of dopants in different regions of a wafer or in different wafers annealed in the same run.

SUMMARY OF THE INVENTION

The object of the present invention is to provide a device of the type defined in the introduction, which makes it possible to solve the problem discussed above to a large extent.

This object is according to the invention obtained by providing a device of the type defined in the introduction, in which said means comprises at least two coils with at least one turn each following upon each other in a longitudinal direction of the susceptor and a current source arranged to cause a current to flow in each coil in a direction of rotation around the susceptor walls opposite to that of the other coil for heating said walls.

This means that magnetic fields oppositely directed will be created in the walls of the susceptor. and these fields will counteract each other in the region of the susceptor walls between the coils and close thereto, so that the magnetic flux density will be higher closer to the ends of the susceptor than in said region. This so called anti-polar induction heating means that less heat energy is supplied to a region of the susceptor walls where the heat losses are low and more heat energy may be supplied to regions of the walls where the heat losses to the ambient are higher, so that the temperature gradient in the longitudinal direction of the susceptor may be kept considerably lower than in the known devices described above. In the case of epitaxial growth by Chemical Vapour Deposition this means a possibility to use a larger area of the inner room of the susceptor for the growth resulting in a higher number of objects grown in the same run and by that a saving of costs. Additionally, the quality of the objects grown will also be higher as a consequence of a more uniform temperature inside the susceptor. In the case of using the device for annealing of wafers the much more uniform temperature through the susceptor will make it possible to considerably reduce the occurrence of different degrees of activation of dopants in different regions of a wafer or in different wafers annealed in the same run.

According to a preferred embodiment of the invention each of said coils surrounds substantially one half of the susceptor with respect to said longitudinal direction thereof. This means that the region with a decreased heating will be located in the middle of the susceptor and more heat will be supplied in the directions of the end of the susceptor, so that an area of a substantially constant temperature inside the susceptor may be extended remarkably in the longitudinal direction of the susceptor.

According to another preferred embodiment of the invention at least one of the coils has a plurality of turns, and the heating of the susceptor may of course be controlled better with a plurality of turns of the coils than would each coil only have one turn, although such an embodiment is also within the scope of the present invention and conceivable for very short susceptors.

According to another preferred embodiment of the invention said coils have different numbers of turns, which they may have for different reasons, such as a wish to have a somewhat lower temperature inside the susceptor at one end thereof. Another case with different numbers of turns in the coils is a device in which a first end of the susceptor as seen in the longitudinal direction thereof has thicker walls than the other, and the coil located closest to said first end will then have more turns than the other coil.

According to another preferred embodiment of the invention said coils are formed by one and the same conductor by changing the winding direction thereof, so that one and the same current from the current source will flow through the coils. This constitutes a simple and cost efficient way to realise more than one coil, since only one current source is needed and no control equipment is needed for synchronising a control of separate current sources for separate coils. However, it is pointed out that it may in some cases be preferred to have coils made of separate conductors for obtaining currents of different intensities in the two coils, in which the currents may have a fixed relation to each other or means may be arranged for individually controlling the current intensity of each coil. This means that more heat may be supplied to a region of the susceptor walls where the heat dissipation by radiation is higher and a high temperature may be accepted.

According to another preferred embodiment of the invention the susceptor and heating means are adapted to carry out a heat treatment of an object of SiC, one or more group III-nitrides, an alloy of SiC and one or more group III-nitrides, or diamond. These materials are all of the so called "wide band gap type", which means that the energy gap between the valence band and the conduction band is wide, and comparatively high temperatures are needed for heat treatment, in the form of epitaxial growth or annealing, of these materials. In the case of SiC, the epitaxial growth is preferably carried out at a temperature above 1400° C., preferably above 1500° C., and very preferred between 1500 and 1700° C., but a possibility to grow at a high growth rate will be even higher at a temperature between 1700 and 2100° C. A temperature in this region is also needed for the annealing process of an object of SiC.

A method for heat treatment of an object in a susceptor according to the appended independent method claim is also a part of the present invention.

The advantages of such a method and the preferred embodiments thereof defined in the dependent method claims will appear clearly from the above discussion of the device according to the present invention.

Further advantages and advantageous features of the invention appear from the following description and the other dependent claims.

BRIEF DESCRIPTION OF THE DRAWINGS

With reference to the appended drawings, below follows a specific description of preferred embodiments of the invention cited as examples.

In the drawings.

DETAILED DESCRIPTION OF PREFERRED EMBODIMENTS OF THE INVENTION

Figure 3:
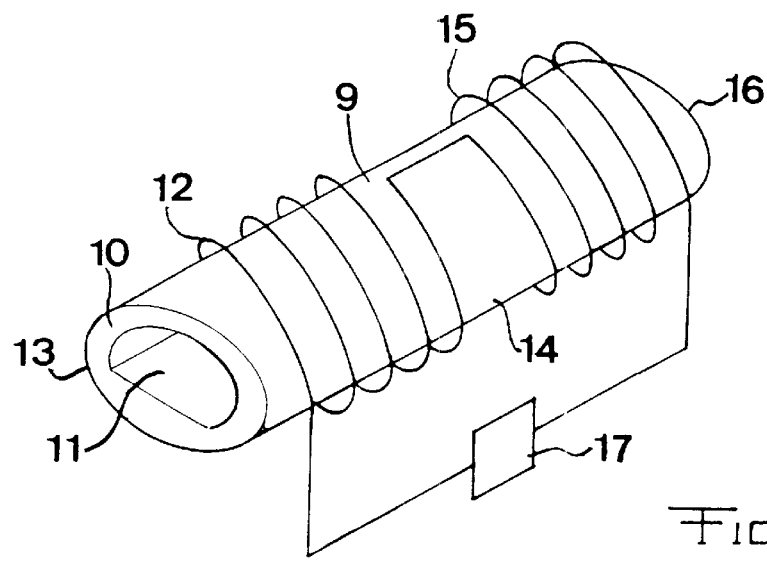
FIG. 3 is a view corresponding to FIG. 1 of a device according to a first preferred embodiment of the invention.

A device for heat treatment according to a preferred embodiment of the invention is very schematically illustrated in FIG. 3. This device comprises a susceptor 9 having comparatively thick walls 10 made of a material able to couple inductive with an Rf-field for inductive heating of the walls, for example graphite, and an inner room 11 adapted to receive an object to be subjected to a heat treatment, such as a substrate for epitaxial growth of a poly- or monocrystalline material on top thereof. The walls of the susceptor are surrounded by Rf (Radio frequency)-field radiating means in the form of a first coil 12 wound in a first direction of rotation around the susceptor from one end 13 thereof and towards the middle section 14 and a second coil 15 wound from the middle section and to the opposite end 16 of the susceptor in the opposite direction of the first coil. The two coils are formed by one and the same conductor changing the winding direction from one coil to the other.

Figure 4:
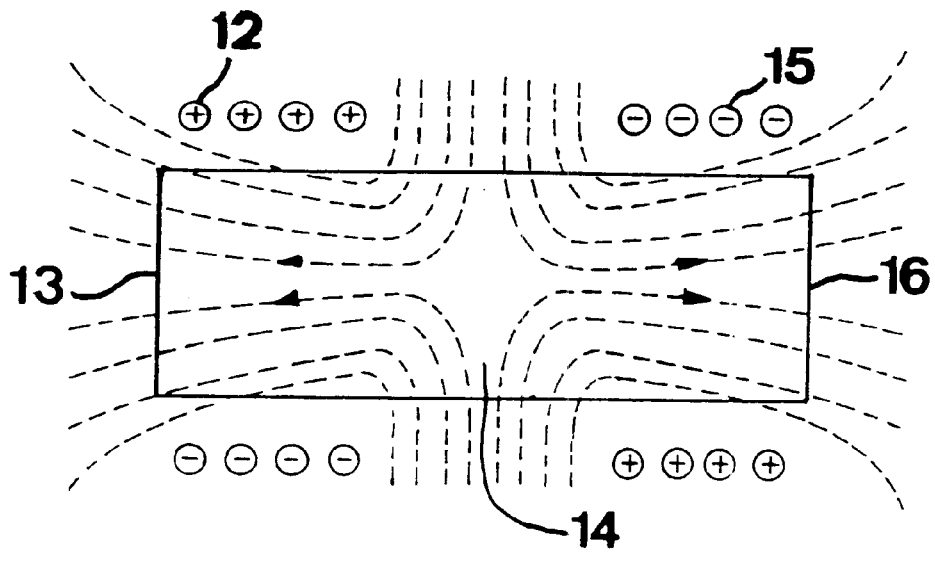
FIG. 4 is a view corresponding to FIG. 2 of the device according to FIG. 3.

The magnetic field from the coils through the susceptor walls has the appearance illustrated in FIG. 4. Accordingly, the magnetic flux density, upon which the Eddy currents causing the heating depend, will be lower in the middle section 14 of the susceptor than at the ends thereof, since the magnetic field lines will be oppositely directed in this section and they will also leave the susceptor walls in the region between the two coils.

This means that the heat supply to this region through the coils will be lower than to the ends of the susceptor walls where the heat losses to the gas surrounding the susceptor will be higher as a consequence of the larger surfaces for heat exchange therewith. The heat power supplied to the susceptor walls and by that the temperature thereof may be controlled by controlling the current source 17 supplying an alternating current to the coils.

Figure 5:
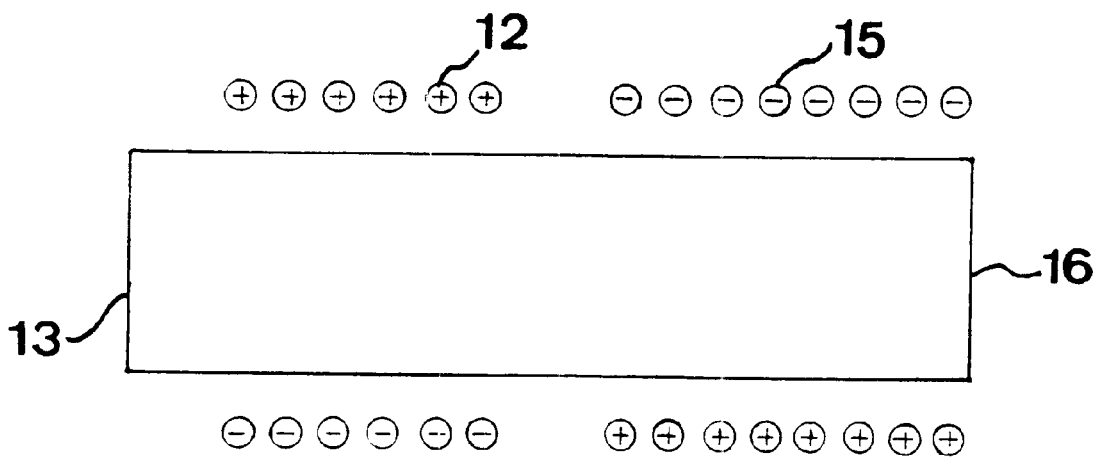
FIG. 5 is a simplified side elevation view of a part of a device according to a second preferred embodiment of the invention.

A device according to another preferred embodiment of the invention is schematically illustrated in FIG. 5. It is in this case shown that it is possible to let one coil 12 start at a distance from the end 13 in question of the susceptor for avoiding that the temperature of the susceptor will be too high at the end of entrance of gases for epitaxial growth by Chemical Vapour Deposition, which could cause a premature cracking of the gases, such as silane and propane for the growth of SiC. It is also shown that it is possible to have different numbers of turns in the different coils, namely a higher number of turns in the coil closest to the end 16. However, it should be pointed out that such premature cracking may sometimes be desired for utilising also the front part of the channel for the growth, and this embodiment will not be chosen then.

It would also be possible to have a heating means with more than two coils, and in such a case the current source may be arranged to cause a current to flow in different directions around the susceptor in different coils such as for example in the same direction around the susceptor walls in every second coil as seen in the longitudinal direction of the susceptor. But also other combinations are conceivable.

Figure 1:
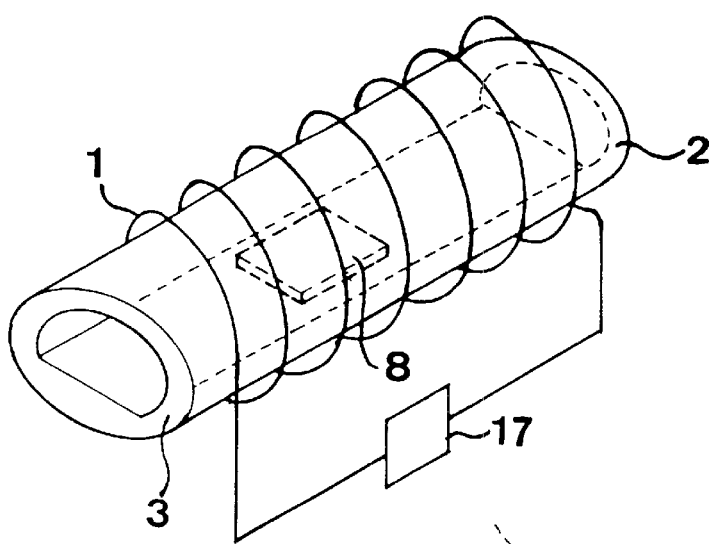
FIG. 1 is a simplified perspective view of a device for heat treatment of objects according to the prior art.
Figure 2:
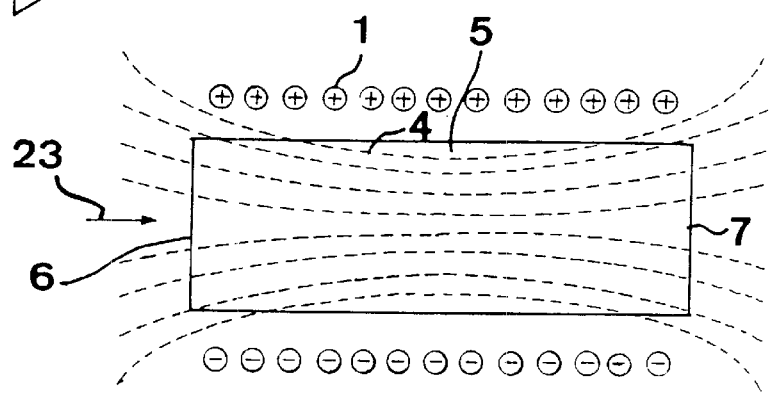
FIG. 2 is a schematical side elevation view of the susceptor and the heating means of the prior art device according to FIG. 1.
Figure 6:
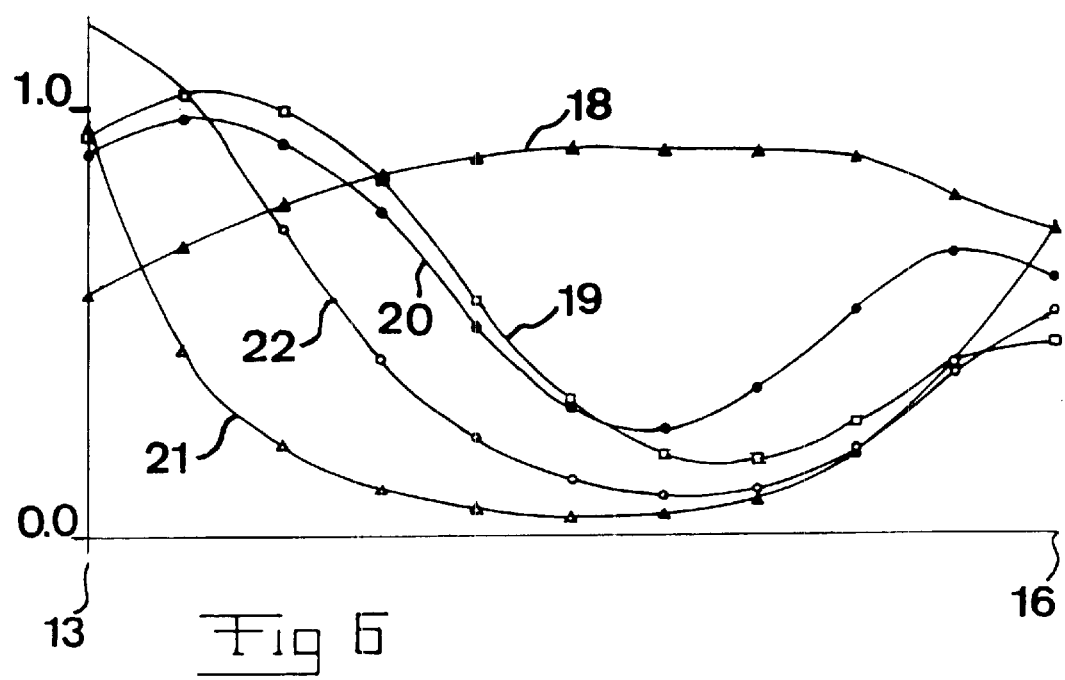
FIG. 6 is a graph of the heat supply to the walls of different susceptors in a device according to the prior art and devices according to different embodiments of the invention versus the distance from one end to the other of the susceptor in the longitudinal direction thereof.

It is shown in FIG. 6 how the heat supply to the susceptor walls will be distributed in the longitudinal direction of the susceptor from one end 13 to the other 16 for different designs of the heating means, but with the same susceptor. These values are calculated. 18 belongs to a susceptor heated through a coil according to the prior art as shown in FIG. 1, 19 a device with a first coil having five turns in one direction and a second coil having three turns in the opposite direction, 20 a first coil having five turns in one direction and a second coil having four turns in the opposite direction, 21 a first coil having one turn in one direction and a second coil having one turn in the opposite direction, and finally 22 a first coil having three turns in one direction and a second coil having two turns in the opposite direction. It appears clearly that more heat will be supplied to the ends of the susceptor than to the mid section thereof in the devices according to the present invention, whereas the heat supply will be higher in the mid section than at the ends for the standard device.

Figure 7:
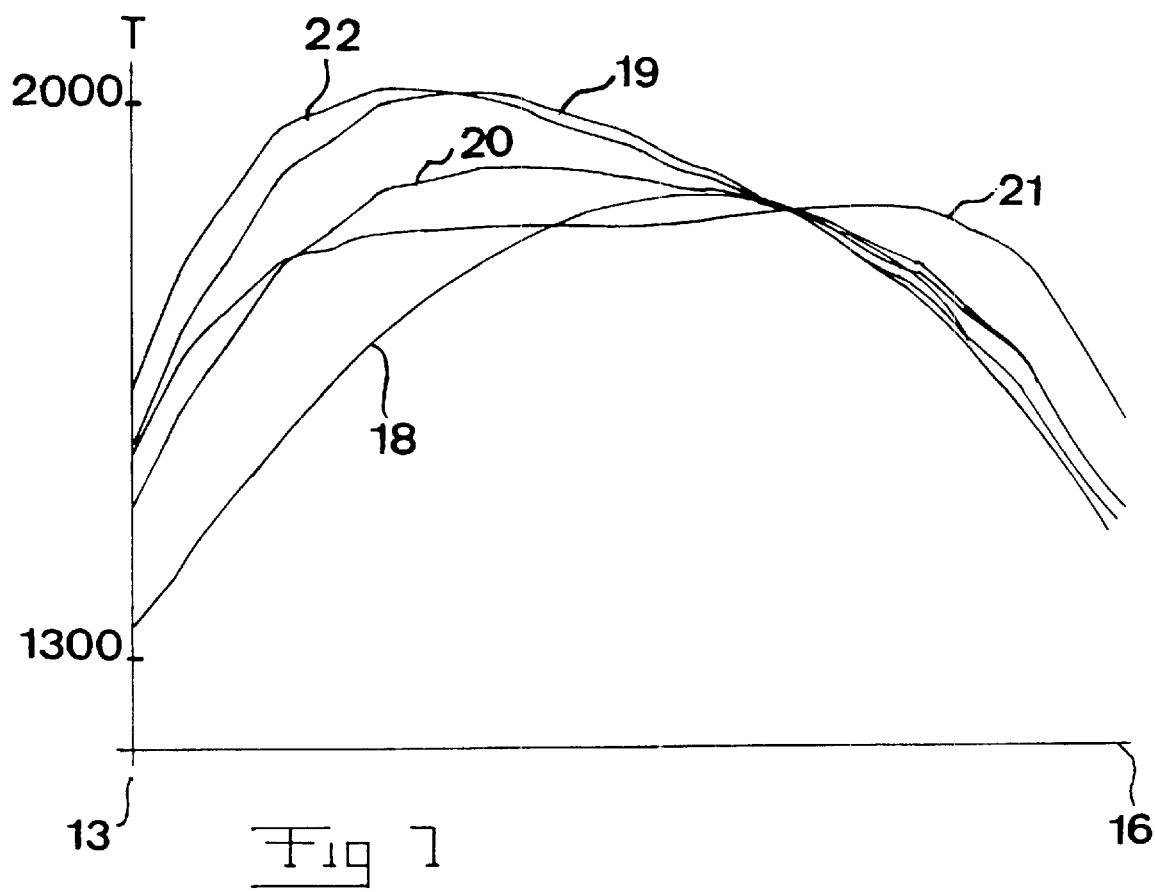
FIG. 7 is a graph of the temperature just above the susceptor floor versus the distance from one end of the susceptor in the longitudinal direction thereof for a prior art device and devices according to different embodiments of the present invention.

FIG. 7 shows what this means in the practise for the temperature T from one end 13 of the susceptor to the other 16 for the different coil configurations of FIG. 6. The same reference numbers have been used here as in FIG. 6. It appears that the coil configuration according to the prior art (curve 18) will only have a nearly constant temperature, i.e. a low temperature gradient, in a very small restricted area, whereas this area is considerably extended for the coil configurations for anti-polar induction heating according to the present invention. This means that the growth area for for instance the growth of mono-crystalline SiC-layers might be at least doubled, which means that twice as much wafers may be grown in the same growth run. The deposit quality will also be improved because of the lower temperature gradient in the growth region.

The invention is of course not in any way restricted to the preferred embodiments described above, but many possibilities to modifications thereof would be apparent to a man with ordinary skill in the art.

Other type of heat treatments than those mentioned above are conceivable.

It will also be possible to vary the relation of the number of turns of the different coils in other ways than described above.

This device may also be used for heat treatment of objects of other materials than those mentioned above, also for the growth of materials having a much lower growth temperature.

"Rf-field" means as used in the claims a frequency of 1 kHz–2 MHz in the coils, but the frequency will normally be 1 kHz–100 kHz.

What is claimed is:

1. A device for heat treatment of an object comprising a susceptor (9) having walls (10) surrounding an inner room (11) adapted to receive the object and Rf-field radiating means (12, 15) arranged outside the walls and adapted to heat the walls and by that said object, characterized in that said means comprises at least two coils (12, 15) following upon each other without overlap in a longitudinal direction of the susceptor, each coil having at least one turn, and a current source (17) arranged to cause a current to flow in each coil in a direction of rotation around the susceptor walls opposite to that of the other coil for heating said walls.

2. A device according to claim 1, characterized in that each of said coils (12, 15) surrounds substantially one half of the susceptor with respect to said longitudinal direction thereof.

3. A device according to claim 1, characterized in that at least one of the coils (12, 15) has a plurality of turns.

4. A device according to claim 1, characterized in that said coils (12, 15) have the same number of turns.

5. A device according to claim 1, characterized in that said coils (12, 15) have different numbers of turns.

6. A device according to claim 5, characterized in that a first end (16) of the susceptor as seen in the longitudinal direction thereof has thicker walls than the other, and that the coil (15) located closest to said first end has more turns than the other coil.

7. A device according to claim 1, characterized in that said coils (12, 15) are formed by one and the same conductor by changing the winding direction thereof, so that one and the same current from the current source (17) will flow through the coils.

8. A device according to claim 1, characterized in that said means comprises more than two coils, and that the current source is arranged to cause a current to flow in different directions around the susceptor walls in different coils as seen in the longitudinal direction of the susceptor.

9. A device according to claim 1, characterized in that it comprises means for controlling the current source (17) to vary the intensity of the current supplied to the coils and/or the relation between the currents supplied to the different coils.

10. A device according to claim 1, characterized in that the walls (10) of the susceptor are made of graphite.

11. A device according to claim 1, characterized in that said inner room (11) of the susceptor is formed by a channel through the susceptor for enabling a flow of gases through the susceptor.

12. A device according to claim 11, characterized in that said inner room (11) is adapted to receive at least one substrate for epitaxial growth of an object by Chemical Vapour Deposition on said substrate.

13. A device according to claim 1, characterized in that said inner room (11) of the susceptor is adapted to receive a semiconductor wafer, and said heating means (12, 15) is arranged to heat said walls and by that said semiconductor wafer to a temperature being high enough for annealing the semiconductor wafer.

14. A device according to claim 1, characterized in that the susceptor (9) and heating means (12, 15) are adapted to carry out a heat treatment of an object of SiC, one or more group III-nitrides, an alloy of SiC and one or more group III-nitrides, or diamond.

15. A device according to claim 1, characterized in that said heating means (12, 15) are arranged to heat the susceptor walls and by that the object at a temperature above 1400° C., preferably above 1500° C., between 1500 and 1700° C. or between 1700 and 2100° C.

16. A device for heat treatment of an object, comprising:
a susceptor (9) having walls that surround an inner room (11) adapted to receive the object;
at least two coils (12, 15) wound circumferentially around the susceptor along a longitudinal axis of the susceptor;
a current source attached to the at least two coils to generate a current flow in each coil in a direction of rotation around the susceptor opposite to that of the other coil;
an RF-field radiating means, comprising the at least two coils and the current source, for heating the walls and thereby the object contained in the inner room, wherein the radiating means individually regulates the heat transferred to the walls at discrete intervals along the longitudinal axis to maintain a substantially uniform temperature or temperature gradient throughout the length of the inner room.

17. The device for heat treatment of an object according to claim 16, wherein:

the number of turns of each of the coils and the spatial separation of each turn regulate the temperature profile within the inner room, along the longitudinal axis.

18. The device for heat treatment of an object according to claim 16, wherein:

the radiating means generates a temperature within the room, greater than 1,400 degrees centigrade.

19. The device for heat treatment of an object according to claim 16, wherein:

the radiating means generates a temperature within the room between 1,500 and 1,700 degrees centigrade.

20. The device for heat treatment of an object according to claim 16, wherein:

the radiating means generates a temperature within the room between 1,700 and 2,100 degrees centigrade.

21. The device for heat treatment of an object according to claim 16, wherein:

a substrate is arranged in the room and the radiating means regulates the heat profile within the room to control the rate of an epitaxial growth on the object by chemical vapor deposition.

* * * * *